United States Patent
Komura et al.

(12) 
(10) Patent No.: US 6,519,999 B2
(45) Date of Patent: Feb. 18, 2003

(54) METER HAVING POINTER-ZERO-POSITION ADJUSTING FUNCTION

(75) Inventors: Takashi Komura, Toyota (JP); Hideki Asano, Nisshin (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/885,194

(22) Filed: Jun. 21, 2001

(65) Prior Publication Data

US 2002/0014104 A1 Feb. 7, 2002

(30) Foreign Application Priority Data

Jul. 25, 2000 (JP) .......................... 2000-224089

(51) Int. Cl.$^7$ .................. G01R 17/00; G01R 17/14; G01P 21/00; G01P 21/02
(52) U.S. Cl. ........................ 73/1.88; 73/1.37
(58) Field of Search ............... 368/11; 29/595; 318/696; 324/144; 73/1.88

(56) References Cited

U.S. PATENT DOCUMENTS 5,032,781 A * 7/1991 Kronenberg ............ 318/696
5,333,371 A * 8/1994 Mittenbühler et al. ........ 29/595
5,802,016 A * 9/1998 Kubota et al. ............. 368/11
5,994,893 A * 11/1999 Maruyama et al. ......... 324/144

* cited by examiner

*Primary Examiner*—Daniel S. Larkin
*Assistant Examiner*—Rodney Frank
(74) *Attorney, Agent, or Firm*—Harness, Dickey & Pierce, PLC

(57) ABSTRACT

A meter such as a speedometer for use in an automobile instrument panel includes a pointer driven by a stepping motor. A pulse voltage having a wider pulse width is supplied to the stepping motor to obtain a higher induced voltage to be compared with a threshold voltage for detecting the pointer-zero-position. After the pointer-zero-position is detected, the stepping motor is driven by a pulse voltage having a narrower pulse width to obtain a quicker response of the pointer. In this manner, the pointer-zero-position is accurately adjusted without sacrificing the quick response of the meter pointer.

3 Claims, 6 Drawing Sheets

METER HAVING POINTER-ZERO-POSITION ADJUSTING FUNCTION

CROSS-REFERENCE TO RELATED APPLICATION

This application is based upon and claims benefit of priority of Japanese Patent Application No. 2000-224089 filed on Jul. 25, 2000, the content of which is incorporated herein by reference.

BACKGROUND OF THE INVENTION

1. Field of the Invention

The present invention relates to a meter for use in an automotive instrument panel, a pointer of the meter being driven by a stepping motor.

2. Description of Related Art

A stepping motor for driving a meter pointer includes a magnet rotor and field coils. The magnet rotor is usually magnetized to have plural poles, and therefore, the magnet rotor has plural stable positions in its rotation. If an overload is imposed on a rotational axis of the magnet rotor, the magnet rotor tends to take a wrong rotational position which is shifted from a right position to a neighboring stable position. In a speedometer for use in an automotive vehicle, this phenomenon causes an erroneous indication of a vehicle speed.

To alleviate this problem, in conventional meters, the pointer is over-driven toward a stopper positioned at a zero-position of a scale plate upon starting or terminating meter operation, and the pointer is forced to stop at the zero-position. Power supply to the stepping motor has to be stopped when the pointer hits the stopper. If the power supply to the stepping motor is not stopped when the pointer abuts the stopper, the pointer vibrates at the stopper position and generates noise in hitting the stopper repeatedly. Therefore, the halt of the stepping motor has to be detected. In conventional meters, the halt of the stepping motor is electrically detected based on a voltage induced in the field coils. That is, a voltage is induced in the field coils when the magnet rotor is rotating, while no voltage is induced when the magnet rotor is stopped.

However, it is not easy to detect the induced voltage in the field coils because the level of the induced voltage is too low. Usually, alternating pulse voltage is supplied to the field coils to drive the stepping motor, and its pulse width is made narrow to obtain a faster response of the stepping motor. The pulse width corresponds to a renewal time of the meter indication. Usually, the pulse width is set in a range of 0.5 to 1.5 milliseconds. The level of the induced voltage is not high enough to detect the motor halt based on the induced voltage.

SUMMARY OF THE INVENTION

The present invention has been made in view of the above-mentioned problem, and an object of the present invention is to provide an improved meter in which the pointer zero-position is properly adjusted. To surely detect the abutment of the pointer with the stopper, the level of the voltage induced in the filed coils is enhanced by increasing the pulse width of the driving voltage in the pointer zero-position adjustment mode.

A pointer of a meter such as a speedometer for use in an automotive instrument panel is disposed in front of a scale plate having an analog scale thereon. A stopper for stopping the pointer at its zero-position is provided on the scale plate. The pointer is driven by a stepping motor disposed behind the scale plate. The stepping motor is composed of a stator having field coils and a magnet rotor.

For adjusting the zero-position of the pointer, a driving pulse voltage having a wider pulse width (W2) is supplied to the field coils thereby to rotate the magnet rotor. When that driving voltage is at zero level, the voltage supply to one of the field coils is shut off, and a voltage (Vi) induced in that field coil is detected. The induced voltage (Vi) is compared with a predetermined threshold voltage (Vth).

If the induced voltage (Vi) is lower than the threshold voltage (Vth), it is determined that the pointer has stopped at the zero-position by abutting the stopper. At this point, the voltage supply to the field coils is discontinued. Thus, the zero-position of the pointer is accurately set. After the pointer zero-position adjustment is completed, a driving pulse voltage having a narrower pulse width (W1) is supplied to the field coils to operate the meter in an operating mode. Preferably, the pulse width (W2) is set to a level which is about two times the pulse width (W1). The pointer zero-position adjustment may be performed upon commencement of power supply to the meter or when the power supply is shut off.

According to the present invention, a higher induced voltage (Vi) is obtained because the driving pulse having a wider pulse width (W2) is supplied to the stepping motor in the pointer zero-position adjustment mode. Therefore, the zero-position is easily and accurately detected by comparing the induced voltage (Vi) with the threshold voltage (Vth), while avoiding pointer vibration otherwise caused at the zero-position. Further, the pointer response is quicker because the driving pulse having narrower pulse width (W1) is supplied to the stepping motor in the normal operation mode. Other objects and features of the present invention will become more readily apparent from a better understanding of the preferred embodiment described below with reference to the following drawings.

DETAILED DESCRIPTION OF THE PREFERRED EMBODIMENT

Figure 1:
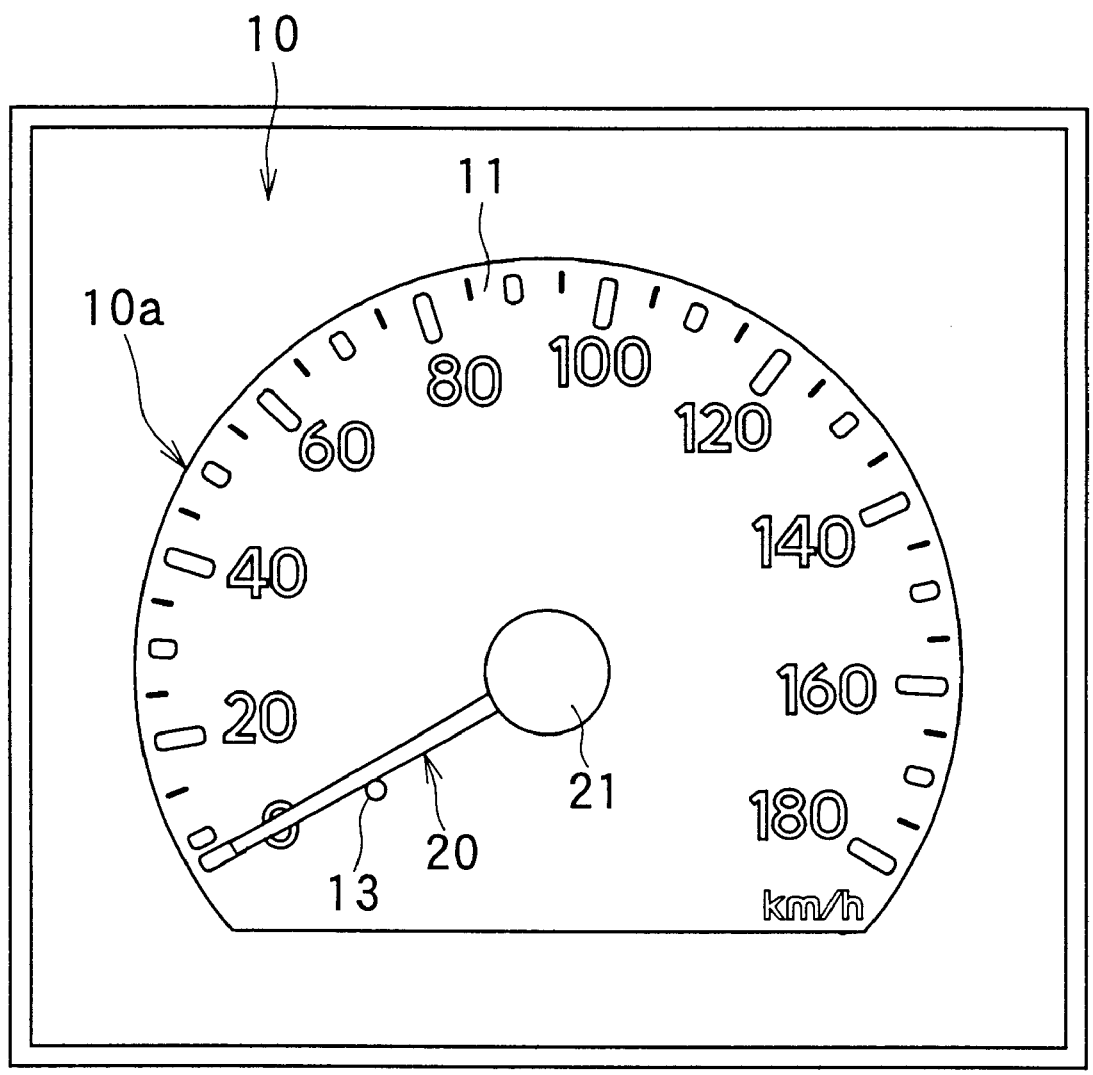
FIG. 1 is a front view showing a meter for use in an automotive instrument panel as a speedometer.
Figure 2:
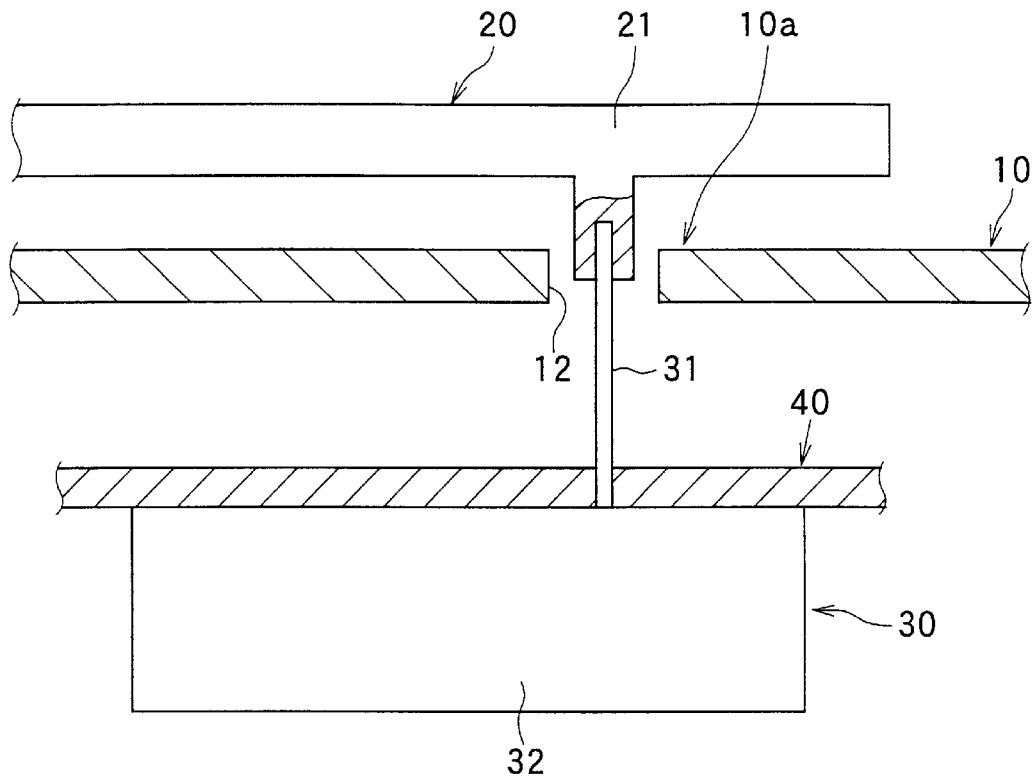
FIG. 2 is a partial cross-sectional view showing the speedometer shown in FIG. 1.

An embodiment of the present invention will be described with reference to the drawings. FIGS. 1 and 2 show a structure of a speedometer for use in an automotive instrument panel. A pointer 20 is disposed in front of a meter panel 10 having a scale plate 10a thereon. A scale 11 showing a vehicle speed from 0 km/h to 180 km/h is formed on the scale plate 10a. The pointer 20 is connected to a pointer shaft 31 via a pointer base 21. The pointer shaft 31 is connected to a driving unit 30 that drives the pointer shaft 31. A stopper 13 is provided in front of the scale plate 10a, so that the pointer 20 stops at the zero-position by engaging with the stopper 13.

The driving unit 30 containing a driving mechanism 32 therein is fixed to a rear surface of a wiring board 40 which is positioned behind the meter panel 10. The driving mechanism 32 includes a stepping motor M shown in FIG. 3 and a reduction gear train (not shown) that transfers rotational force of the stepping motor M to the pointer shaft 31 with a reduced speed. The pointer shaft 31 extends from the driving unit 30 to the front surface of the meter panel 10 through a hole 12 formed in the meter panel 10.

Figure 3:
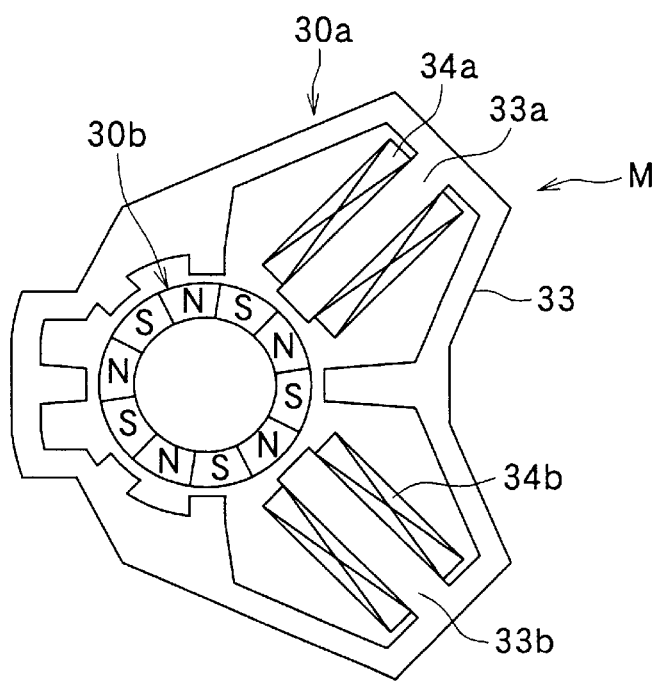
FIG. 3 is a cross-sectional view showing a stepping motor for driving the speedometer.

As shown in FIG. 3, the stepping motor M is composed of a stator 30a and a magnet rotor 30b. The stator 30a is composed of a yoke 33 and a pair of filed coils 34a, 34b wound around poles 33a, 33b of the yoke 33, respectively. The magnet rotor 30b is rotatably supported within the yoke 33 and is magnetized to form plural N and S poles alternately on its outer periphery. The outer periphery of the magnet rotor 30b faces the tips of poles 33a, 33b with a certain air gap.

Figure 6:
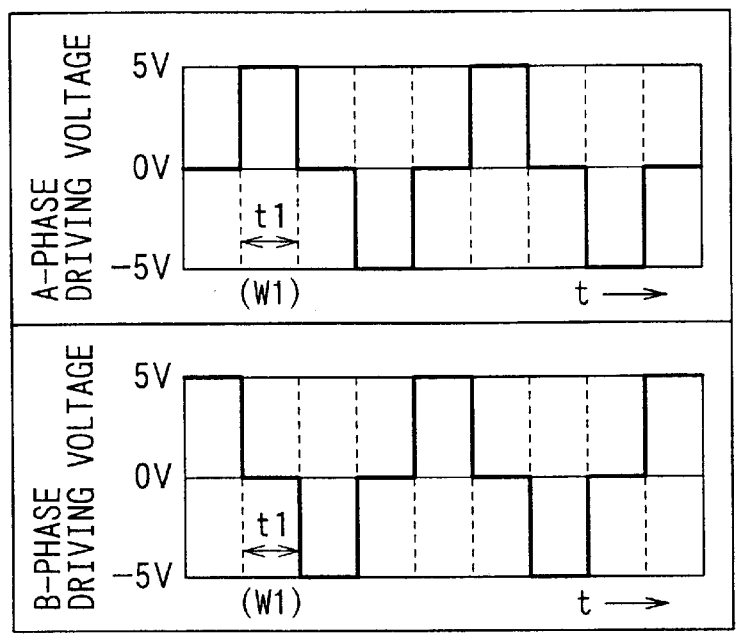
FIG. 6 is a timing chart showing waveforms of a driving voltage supplied to the stepping motor in its normal operation mode.

FIG. 6 shows driving pulse voltages supplied to the field coils 34a, 34b in the normal operating mode. A-phase driving voltage is supplied to the field coil 34a, and B-phase driving voltage is supplied to the field coil 34b. Magnetic flux of a cosine waveform, the phase of which is different from each other by 90 degrees, is generated in each field coil 34a, 34b, and flows through the yoke 33 and poles of the magnet rotor 30b. Thus, the magnet rotor 30b is rotated. The pulse width t1 shown in FIG. 6 corresponds to a renewal time of the speed indication, which is set in a range from 0.5 to 1.5 milliseconds. The field coils 34a, 34b are referred to as A-phase field coil and B-phase field coil, respectively.

Figure 4:
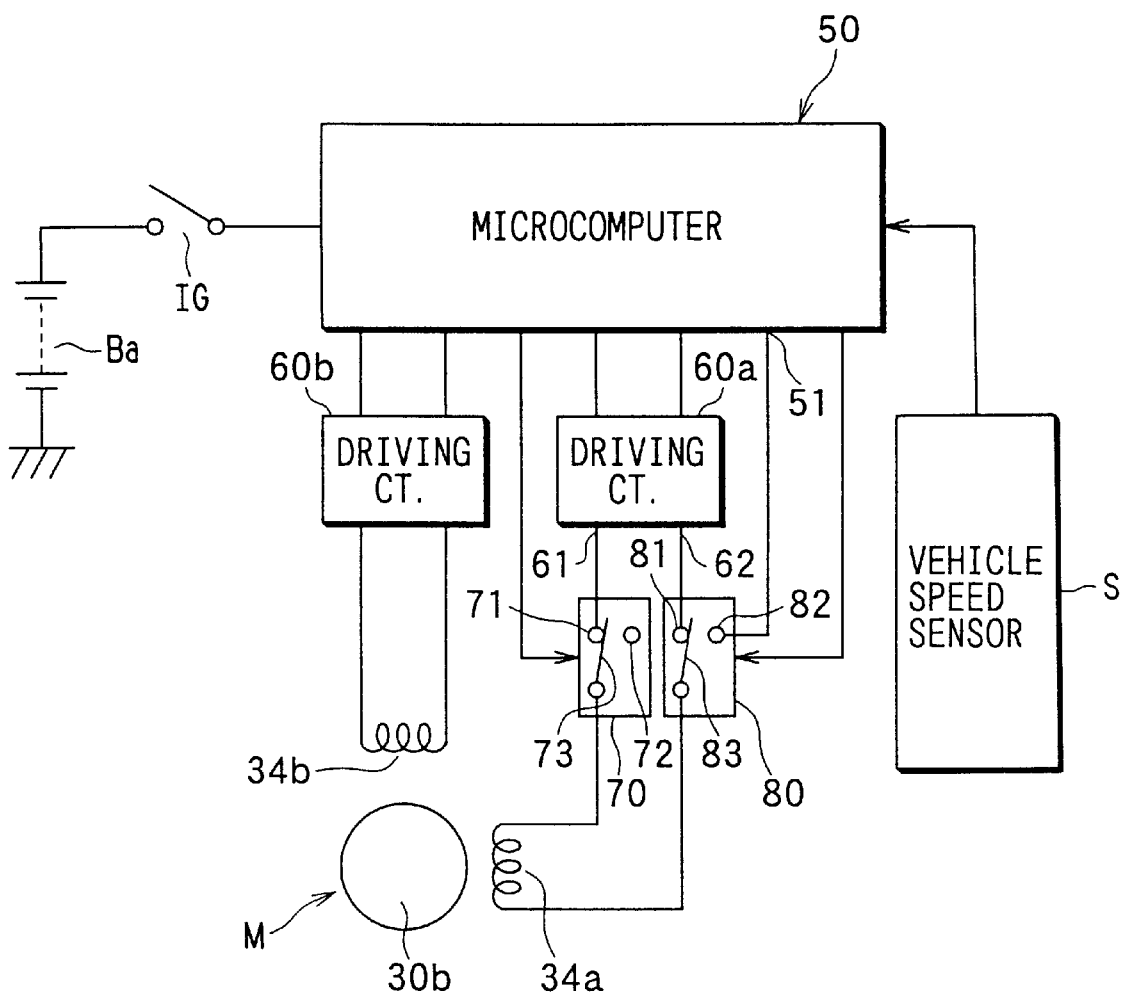
FIG. 4 is a diagram showing a circuit for driving the stepping motor.
Figure 5:
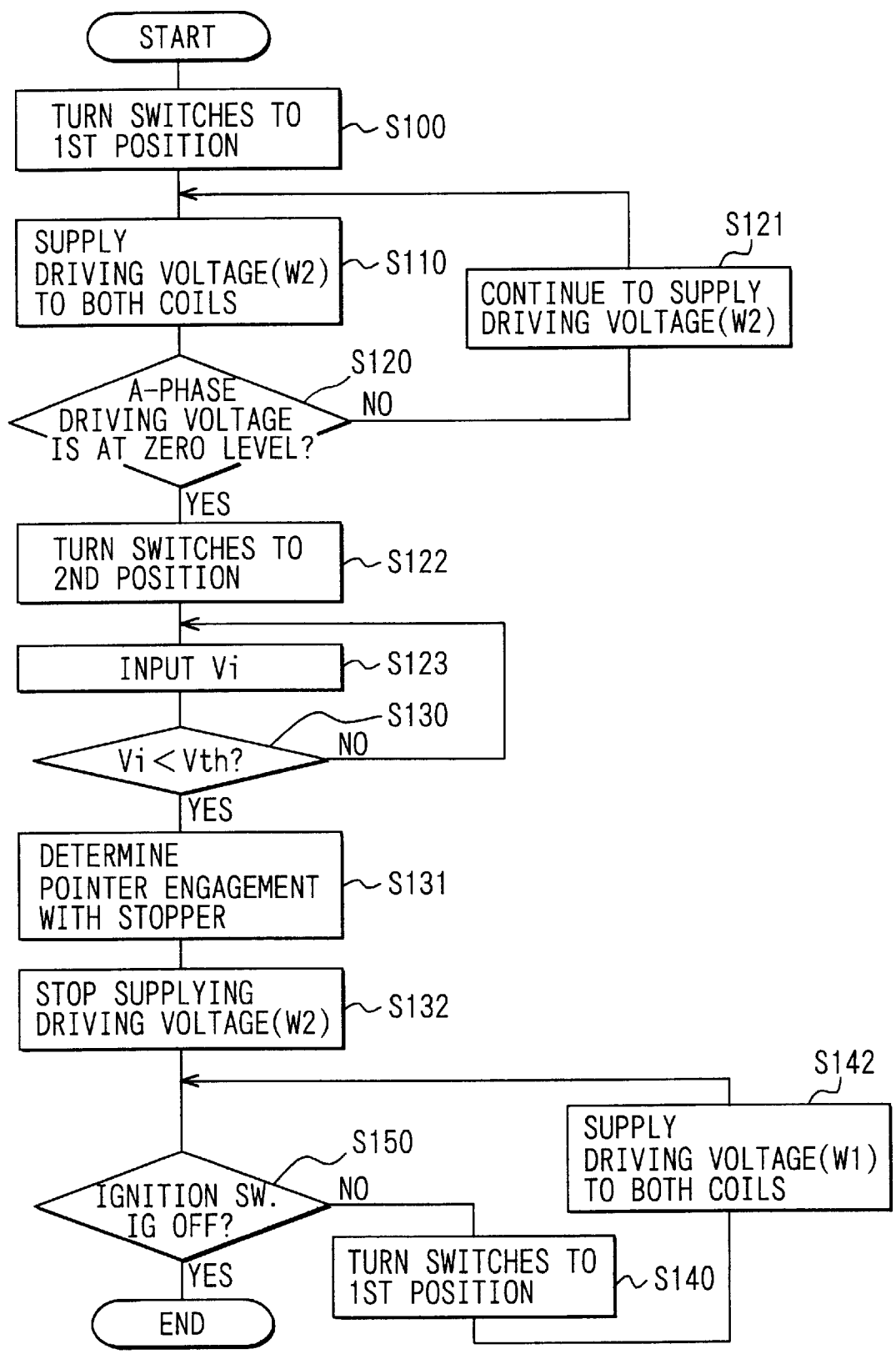
FIG. 5 is a flowchart showing a process for controlling the stepping motor.

Referring to FIG. 4, a circuit for driving the stepping motor M will be described. A microcomputer 50 is connected to a battery Ba through an ignition switch IG. A vehicle speed sensor S supplies signals indicating vehicle speeds to the microcomputer 50. The microcomputer 50 controls the stepping motor M according to a computer program stored therein. The control process is shown in FIG. 5 in detail. A driving circuit 60a connected to the field coil 34a supplies the A-phase driving voltage thereto under the microcomputer control. A driving circuit 60b connected to the field coil 34b supplies the B-phase driving voltage thereto under the microcomputer control.

The driving voltage is supplied from the driving circuit 60a to the filed coil 34a through a pair of switches 70, 80. Both switches 70, 80 are analog switches which are simultaneously controlled by the microcomputer 50. The switch 70 includes a fixed contact 71 connected to an output terminal 61 of the driving circuit 60a, an open contact 72 and a movable contact 73 connected to one end of the field coil 34a. The switch 80 includes a fixed contact 81 connected to an output terminal 81 of the driving circuit 60a, a fixed contact 82 connected to an input port 51 of the microcomputer 50 and a movable contact 83 connected to the other end of the field coil 34a. Both switches 70, 80 are simultaneously brought into a first position (contacts 71 and 73 connected; contacts 81 and 83 connected) and simultaneously brought into a second position (contacts 72 and 73 connected; contacts 82 and 83 connected). The A-phase driving voltage is supplied to the field coil 34a at the first position, while the voltage supply is discontinued at the second position. At the second position, a terminal voltage of the field coil 34a is supplied to the microcomputer 50 through the input port 51.

Figure 7:
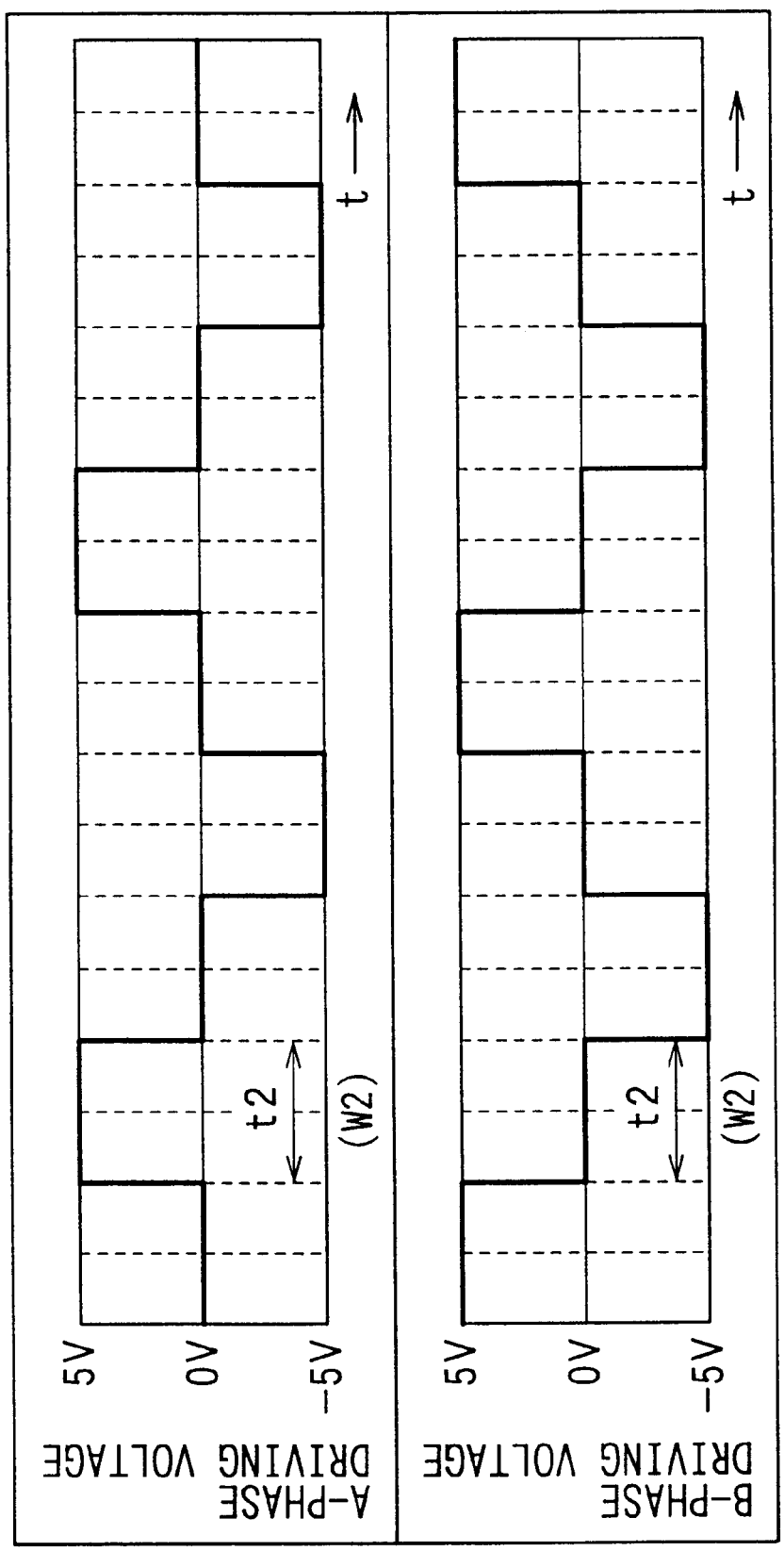
FIG. 7 is a timing chart showing waveforms of a driving voltage supplied to the stepping motor in its pointer zero-position adjustment mode.

Referring to the flowchart shown in FIG. 5, a process for controlling the stepping motor will be explained. Upon closing the ignition switch IG, the microcomputer starts its operation and the vehicle starts running. At step S100, both switches 70, 80 are brought into the first position thereby to connect the driving circuit 60a to the field coil 34a. At step S110, the driving voltage is supplied to both field coils 34a, 35b. The A-phase driving voltage having a pulse width W2 (corresponding to the renewal time t2), shown in the upper portion in FIG. 7, is supplied to the A-phase field coil 34a from the driving circuit 60a. The B-phase driving voltage having a waveform shown in the bottom portion in FIG. 7 is supplied to the B-phase field coil 34b from the driving circuit 60b. The renewal time t2 corresponding to the pulse width W2 is set to two times of the renewal time t1 (the renewal time under the normal operation mode).

The magnet rotor 30b is rotated by the driving voltage supplied to both field coils 34a, 34b. According to rotation of the magnet rotor 30b, voltages are induced in both field coils 34a, 34b. The induced voltages in both filed coils 34a, 34b have phases different from each other. The meter pointer 20 is rotated according to rotation of the magnet rotor 30b, and the rotational angle of the pointer 20 is renewed with the renewal time t2.

At step S120, whether the voltage level of the A-phase driving voltage is zero or not is determined. If the level of the A-phase driving voltage is not zero, the process proceeds to step S121 where both driving voltages continue to be supplied. The magnet rotor 30b is rotated according to the phase difference between the A-phase driving voltage and the B-phase driving voltage. Accordingly, the pointer 20 continues to be rotated. On the other hand, if it is determined that the level of the A-phase driving voltage is zero at step S120, the process proceeds to step S122. At step S122, both switches 70, 80 are brought into the second position to discontinue voltage supply to the field coil 34a. At the same time, one end of the field coil 34a is connected to the input port 51 of the microcomputer 50 through the movable contact 83 and the fixed contact 82. At step S123, the voltage Vi induced in the A-phase field coil 34a is fed to the microcomputer 50.

At step S130, it is determined whether the induced voltage Vi is lower than a predetermined threshold voltage Vth. In this embodiment, the threshold voltage Vth is set to 0.5 volts, considering the fact that the renewal time t2 under the zero-point adjustment mode is set to two times of the renewal time t1 under the normal operation mode. If it is determined that the induced voltage Vi is not lower than the threshold voltage Vth at step S130, the process at steps S123 and S130 is repeated. If it is determined that the induced voltage Vi is lower than the threshold voltage Vth at step S130, the process proceeds to step S131, where it is determined that the meter pointer 20 has engaged with the stopper 13. Then, at step S132, the driving voltage (having the pluse width W2) supply to both field coils 34a, 34b is discontinued.

Figure 8:
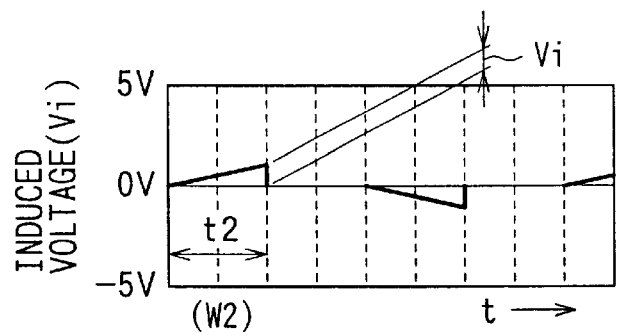
FIG. 8 is a graph showing an induced voltage in the pointer zero-position adjustment mode.
Figure 9:
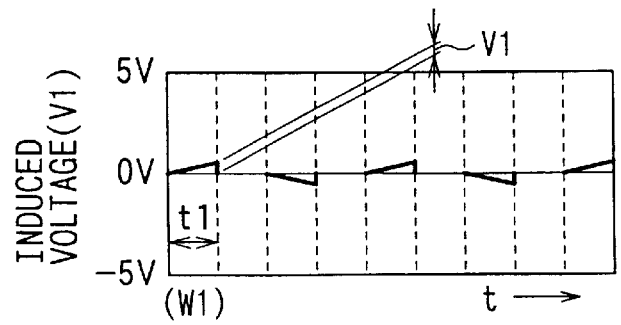
FIG. 9 is a graph showing an induced voltage in the normal operation mode.

Since the renewal time t2 under the pointer zero-position adjustment mode is set longer than the normal renewal time t1, the induced voltage Vi is sufficiently high compared with an induced voltage V1 under the normal operation, as shown in FIGS. 8 and 9. Therefore, the pointer engagement with the stopper is surely and accurately found out, and the pointer zero-position adjustment can be made without fail. Further, since the driving voltage supply to the stepping motor is discontinued at the substantially same time as the pointer 20 abuts the stopper 13, the pointer vibration otherwise occurring at that time is avoided.

Then, the process proceeds to step S150, where whether the ignition switch IG is ON or OFF is checked. If the ignition switch IG is ON, the process proceeds to step S140 where both switches 70, 80 are brought to the first position. At step S142, the driving voltages having the pulse width W1 (corresponding to the normal renewal time t1) shown in FIG. 6 are supplied to both field coils 34a, 34b. The A-phase driving voltage is supplied to the field coil 34a and the B-phase driving voltage is supplied to the field coil 34b. The stepping motor M is rotated by the driving voltages, and the pointer rotational angle is renewed with the renewal time t1. Since the renewal time t1 is set to a sufficiently low level, the pointer quickly responds to vehicle speed changes. If it is determined that the ignition switch IG is OFF at step S150, the process comes to the end.

The present invention is not limited to the embodiment described above, but it may be variously modified. For example, the stopper 13 may not stick out from the front surface of the scale plate 10a. The pointer 20 may carry a member that abuts a stationary member when it comes to the zero-position. The present invention may be applied to other meters than the speedometer, such as engine rotation meters or fuel gauges. Those meters may be used for other purposes than automotive use.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A meter comprising:

a scale plate;

a pointer rotating in front of the scale plate;

a stopper for stopping the pointer at a zero-position;

a stepping motor, for driving the pointer, disposed behind the scale plate, the stepping motor including a magnet rotor and a stator having field coils; and means for supplying driving voltages to the field coils, the driving voltages consisting of alternating pulse signals having a pulse width corresponding to a renewal time for renewing an angular position of the pointer, wherein:

the driving voltage supplying means supplies to the field coils a first driving voltage having a first pulse width in a normal operation mode and a second driving voltage having a second pulse width which is wider than the first pulse width in a pointer-zero-position adjusting mode; and the driving voltage supplying means discontinues supplying the second driving voltage to the field coils in the pointer-zero-position adjusting mode when the second driving voltage is at a zero level and if a voltage induced in one of the field coils is lower than a predetermined threshold voltage.

2. The meter as in claim 1, wherein:

the second pulse width is set to two times of the first pulse width.

3. In a meter including a pointer driven by a stepping motor having field coils and a magnet rotor, the meter further including a stopper for stopping the pointer at zero-position, a method of adjusting a zero-position of the pointer comprising steps of:

upon starting operation of the meter, supplying a second pulse voltage to the field coils for adjusting a pointer-zero-position, a pulse width of the second pulse voltage being wider than a pulse width of a first pulse voltage which is supplied after the pointer-zero-position has been adjusted;

detecting the second pulse voltage being supplied to the field coils;

discontinuing supplying the second pulse voltage to one of the field coils when the second pulse voltage is at zero level;

detecting a voltage induced in one of the field coils when the second pulse voltage is at a zero level;

determining that the pointer is stopped by the stopper if the voltage induced in one of the field coils is lower than the predetermined threshold voltage;

discontinuing supplying the second pulse voltage to the field coils if it is determined that the voltage induced in one of the field coils is lower than the predetermined threshold voltage; and supplying the first pulse voltage to the field coils for normally operating the meter.

* * * * *